(12) United States Patent
Bartley

(10) Patent No.: US 11,984,390 B2
(45) Date of Patent: May 14, 2024

(54) BALL GRID ARRAY UNDERFILLING SYSTEMS

(71) Applicant: Hamilton Sundstrand Corporation, Charlotte, NC (US)

(72) Inventor: Eileen A. Bartley, South Glastonbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 278 days.

(21) Appl. No.: 17/222,809

(22) Filed: Apr. 5, 2021

(65) Prior Publication Data

US 2021/0225748 A1 Jul. 22, 2021

Related U.S. Application Data

(62) Division of application No. 15/902,809, filed on Feb. 22, 2018, now Pat. No. 10,971,439.

(51) Int. Cl.
*H01L 23/00* (2006.01)
*H01L 21/56* (2006.01)
*H01L 23/31* (2006.01)
*H01L 23/498* (2006.01)
*H01L 23/055* (2006.01)
*H05K 3/34* (2006.01)

(52) U.S. Cl.
CPC ...... *H01L 23/49816* (2013.01); *H01L 21/563* (2013.01); *H01L 23/3128* (2013.01); *H01L 23/49838* (2013.01); *H01L 24/06* (2013.01); H01L 23/055 (2013.01); H01L 2924/15311 (2013.01); H05K 3/3436 (2013.01)

(58) Field of Classification Search
CPC ......... H01L 23/49838; H01L 23/49816; H01L 24/06; H01L 21/563; H01L 23/3128; H01L 23/055; H01L 23/20; H01L 2924/351; H01L 2924/15311; H01L 2924/16251; H01L 2924/15151; H05K 3/3436

USPC .......................................................... 257/737
See application file for complete search history.

(56) References Cited

U.S. PATENT DOCUMENTS

| | | | |
|---|---|---|---|
| 6,693,239 B2 | 2/2004 | Myers et al. | |
| 2003/0027373 A1* | 2/2003 | DiStefano | H01L 24/92 438/106 |
| 2005/0145846 A1 | 7/2005 | Brandenburger | |
| 2012/0319245 A1 | 12/2012 | Low | |

(Continued)

OTHER PUBLICATIONS

Merriam-Webster Online Definition of Insert.*

*Primary Examiner* — Hrayr A Sayadian
(74) *Attorney, Agent, or Firm* — Kinney & Lange, P.A.

(57) ABSTRACT

A ball grid array (BGA) assembly can include a component substrate having at least one underfill channel defined therethrough providing fluidic communication between a first side of the component substrate and a second side of the component substrate, a plurality of pads or leads exposed on the second side and configured to be soldered to a mating PCB, a cover mounted to the component substrate defining a reservoir cavity between the first side and the cover, and an underfill material disposed within the reservoir cavity such that the underfill material can flow through the at least one underfill channel to a gap defined between the second side and the mating PCB when the component substrate is being soldered to the mating PCB.

5 Claims, 5 Drawing Sheets

(56) References Cited

U.S. PATENT DOCUMENTS

2015/0262956 A1 9/2015 Hou et al.
2016/0013173 A1 1/2016 Vadhavkar et al.

* cited by examiner

BALL GRID ARRAY UNDERFILLING SYSTEMS

CROSS-REFERENCE TO RELATED APPLICATIONS

This application is a divisional of U.S. patent application Ser. No. 15/902,809, filed Feb. 22, 2018, the entire content of which is incorporated herein in its entirety.

BACKGROUND

1. Field

The present disclosure relates to ball grid arrays (BGAs), more specifically to underfilling of BGAs.

2. Description of Related Art

Ball grid arrays (BGAs) can utilize underfilling to provide stronger connection between the printed circuit board (PCB) and the package. Traditional underfilling is a multi-step operation, and, especially for small chips, or very densely packed PCB's, providing underfill material under the BGA assembly is very difficult.

The current method of underfilling BGAs is to inject the underfill after reflow. If the space is very tight, as in many modern PCB layouts, a needle filling opening can be fabricated in the PCB, directly under the component, so underfill can be injected from the back side. This is also undesirable because it reduces the available space for running traces in a multilayered PCB, for example.

Such conventional methods and systems have generally been considered satisfactory for their intended purpose. However, there is still a need in the art for improved methods for underfilling, e.g., that are less time consuming. The present disclosure provides a solution for this need.

SUMMARY

In accordance with at least one aspect of this disclosure, an embodiment of a ball grid array (BGA) assembly can include a component substrate having at least one underfill channel defined therethrough providing fluidic communication between a first side of the component substrate and a second side of the component substrate, a plurality of pads or leads exposed on the second side and configured to be soldered to a mating PCB, a cover mounted to the component substrate defining a reservoir cavity between the first side and the cover, and an underfill material disposed within the reservoir cavity such that the underfill material can flow through the at least one underfill channel to a gap defined between the second side and the mating PCB when the component substrate is being soldered to the mating PCB.

In accordance with at least one aspect of this disclosure, an embodiment of a ball grid array (BGA) assembly can include a component substrate (e.g., a BGA printed circuit board (PCB)) having a first side and a second side. The component substrate includes one or more underfill channels defined therethrough that are configured to fluidly communicate the first side of the component substrate and the second side of the component substrate. The assembly includes one or more internal components mounted on the first side of the component substrate, a plurality of pads or leads exposed on the second side and configured to be soldered to a mating PCB, and a cover (e.g., an overmold) attached to the component substrate over the first side of the component substrate.

The cover is shaped to create a reservoir cavity between the first side of the component substrate and the cover. The assembly also includes an underfill material disposed within the reservoir cavity such that the underfill material in a liquid state flows through the one or more underfill channels to provide the underfill material between the component substrate and the mating PCB when the component substrate is soldered to the mating PCB, e.g., in a conventional reflow process.

The assembly can include a gas disposed in the reservoir cavity above the underfill material to push the underfill material through the underfill channels when the underfill material is in a liquid state. The gas can be an inert gas, e.g., nitrogen, argon, or helium, or any other suitable gas.

In certain embodiments, the assembly can include a solder ball disposed on each lead. For example, a solder ball can be pre-attached to each lead that is intended to be used in the electrical circuit, or a plurality of solder balls for any other suitable pattern of pads or leads or all pads or leads.

The underfill material in the cavity can be in an uncured state (in either in a solid or liquid state) at an operating temperature below reflow temperature and in liquid state at least at or above reflow temperature. For example, the underfill material can have a melting point below solder. In certain embodiments, the underfill material can be a polymer.

The one or more underfill channels can include a plurality of underfill channels. In certain embodiments, each of the plurality of underfill channels can be defined in the component substrate between the plurality pads or leads. The underfill channels can be disposed in the component substrate in any suitable pattern, and/or any suitable relation to the pads or leads and/or other component(s) of the BGA assembly.

In certain embodiments, the one or more underfill channels in the component substrate can be filled with a different material that is selected for its melting point temperature to allow the underfill material to flow only after the solder balls have solidified, thus allowing the underfill material to fill the space between the solidified solder balls, but the reflow temperature is still such that the heat provides the cure to solidify the underfill material during the process. In certain embodiments the thermal curing process seals the underfill channels in the component substrate and provides additional strength between the component substrate and the mating PCB.

In accordance with at least one aspect of this disclosure, an embodiment of a method for making a ball grid array (BGA) assembly can include inserting an underfill material into a reservoir cavity inside a cover of a BGA assembly. Inserting the underfill material can include inserting less than the total volume of the reservoir cavity such that there is a gas pocket between the underfill material and the cover. Inserting the underfill material can include injecting the underfill material in a heated liquid state through one or more underfill channels defined through a component substrate of the BGA assembly.

The method can include allowing the underfill material to cool and solidify such that the underfill material blocks the one or more underfill channels to seal the reservoir cavity. The method can be performed in an environment of inert gas such that the gas pocket is a pocket of inert gas.

In accordance with at least one aspect of this disclosure, an embodiment of a method of soldering a ball grid array (BGA) to a printed circuit board (PCB) can include heating an underflow material within a cavity defined between a cover and a first side of a component substrate, flowing the underflow material through at least one channel in the component substrate to a gap defined between a second side of the component substrate and the PCB, the gap including a plurality of solder balls, and soldering the second side to the PCB. The method can include urging the underflow material through the at least one channel with a pressurized gas in the cavity. The method can include pressurizing the gas by increasing temperature of the gas. The method can include liquefying the underflow material with the heating.

In accordance with at least one aspect of this disclosure, an embodiment of a method of installing a ball grid array (BGA) assembly can include placing the BGA assembly (e.g., as described herein and wherein each lead has a solder ball connected thereto) on a mating printed circuit board (PCB) such that solder balls of the BGA contact the mating PCB, applying heat to the BGA to cause reflow of the solder balls and melting of the underfill material, and allowing underfill material to flow from the reservoir cavity, through the one or more underfill channels, and out of the second side of the component substrate to eject underfill material around the solder balls to cause underfilling of the BGA.

The method can include allowing the underfill material to cool to seal the one or more underfill channels. The method can include applying heat causes a gas to expand within the reservoir cavity to push the underfill material through the one or more underfill channels.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
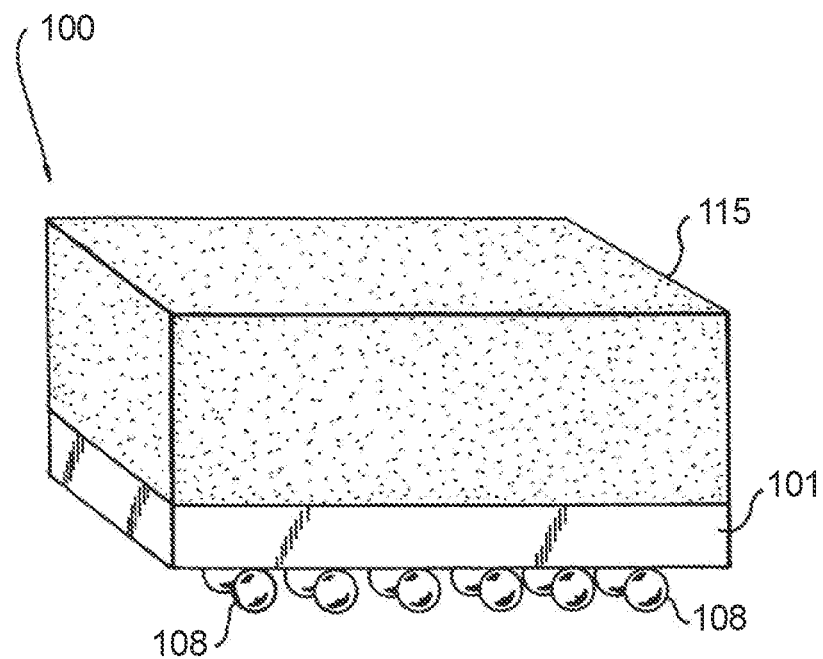
FIG. 1 is a perspective view of an embodiment of a BGA assembly in accordance with this disclosure, shown before underfill material ejection.

Reference will now be made to the drawings wherein like reference numerals identify similar structural features or aspects of the subject disclosure. For purposes of explanation and illustration, and not limitation, an illustrative view of an embodiment of a ball grid array assembly in accordance with the disclosure is shown in FIG. 1 and is designated generally by reference character 100. Other embodiments and/or aspects of this disclosure are shown in FIGS. 2A-4B. The systems and methods described herein can be used to provide automatic underfilling for ball grid array assemblies, e.g., during solder reflow.

Figure 2A:
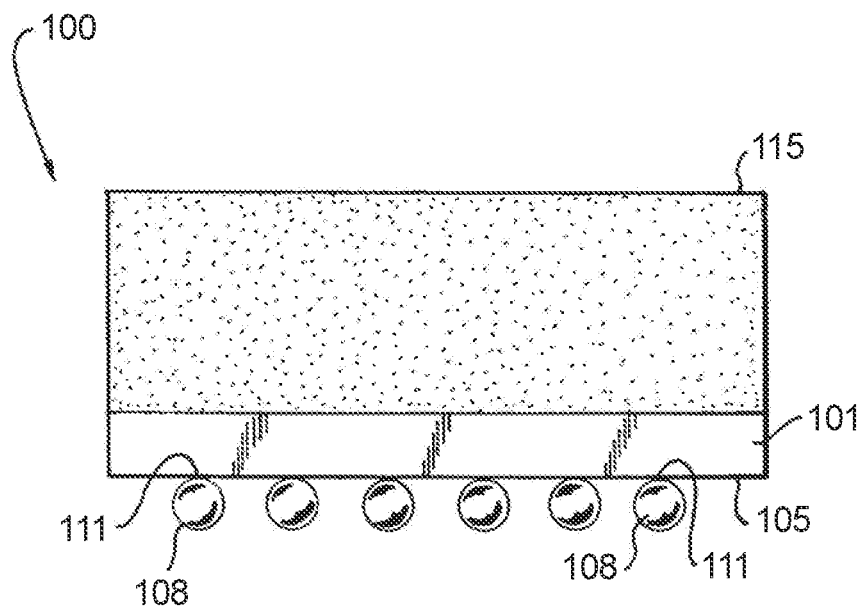
FIG. 2A is a side view of the embodiment of FIG. 1A.
Figure 2B:
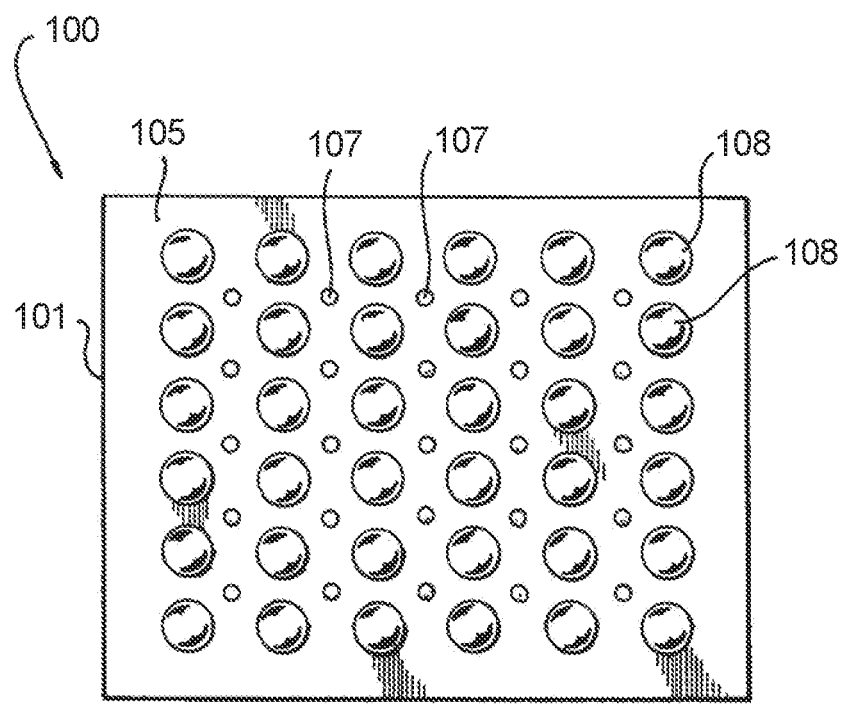
FIG. 2B is an underside view of the embodiment of FIG. 1A.
Figure 2C:
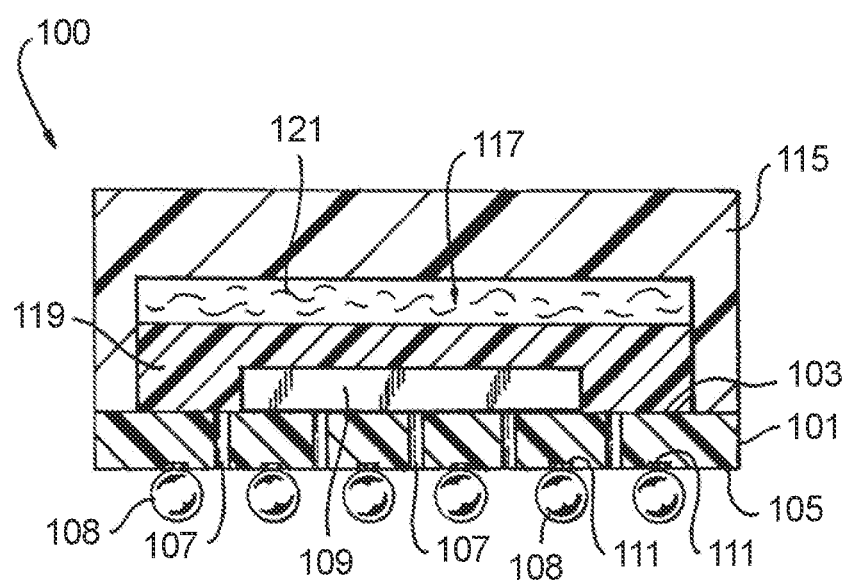
FIG. 2C is a cross-sectional view of the embodiment of FIG. 1A.
Figure 3A:
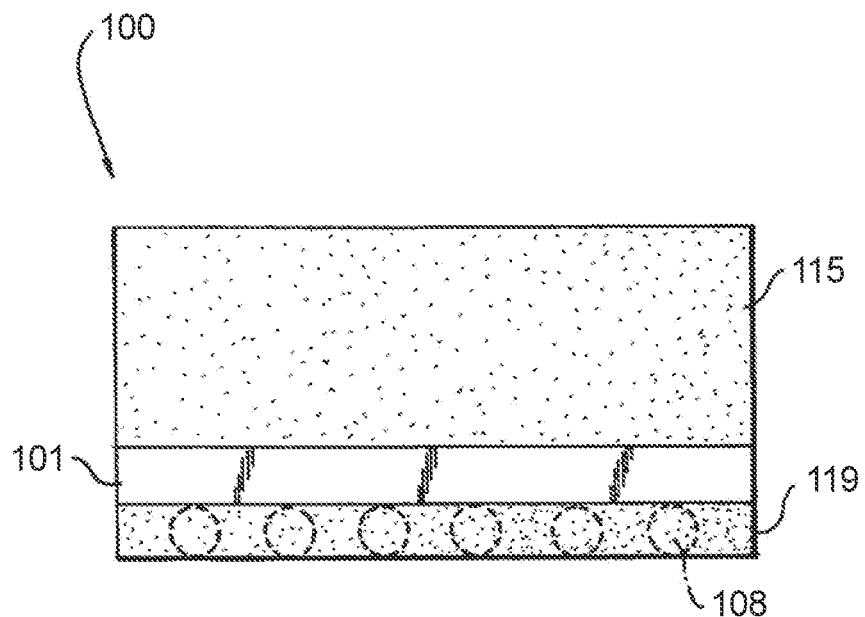
FIG. 3A is a side view of the embodiment of FIG. 1A, shown after underfill material ejection.
Figure 3B:
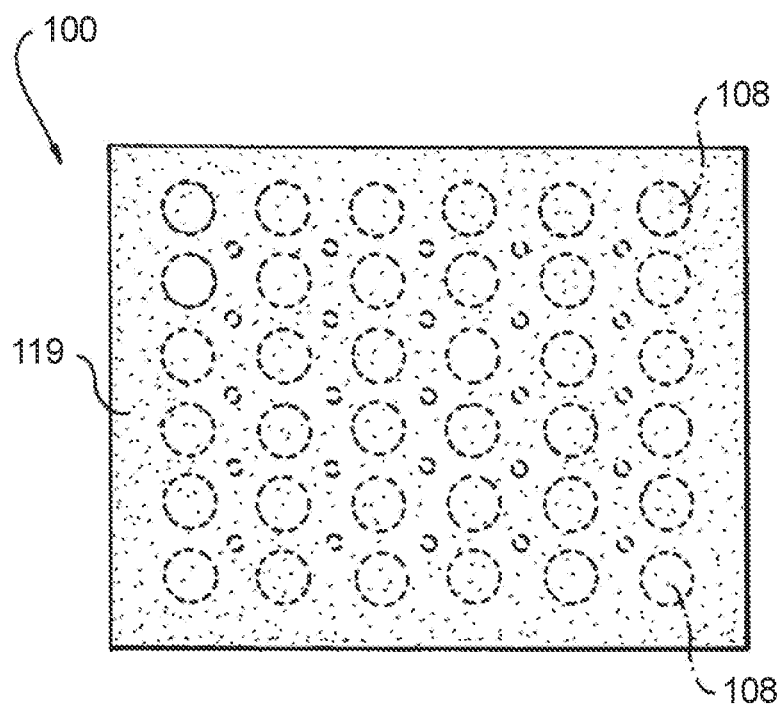
FIG. 3B is an underside of the embodiment of FIG. 3A.
Figure 3C:
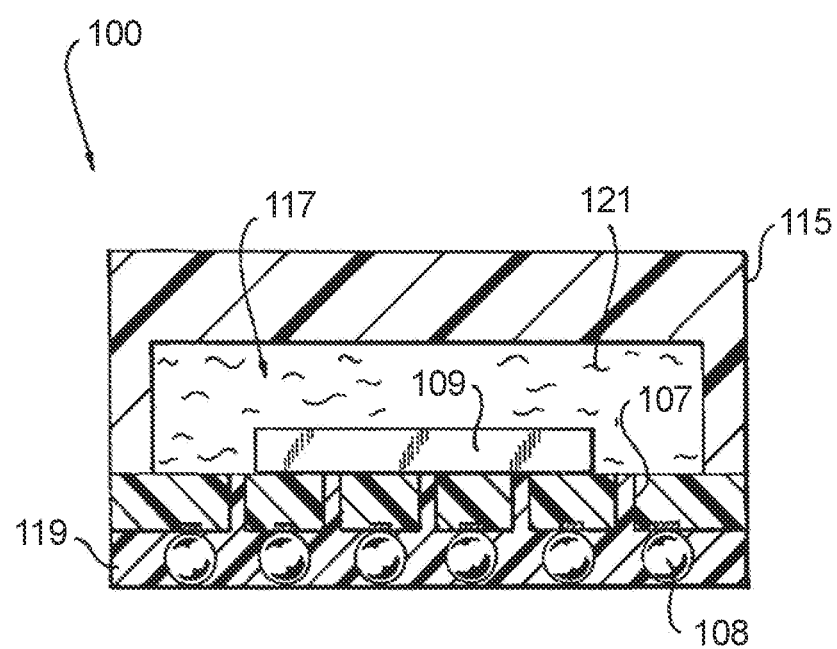
FIG. 3C is a cross-sectional view of the embodiment of FIG. 3A.
Figure 4A:
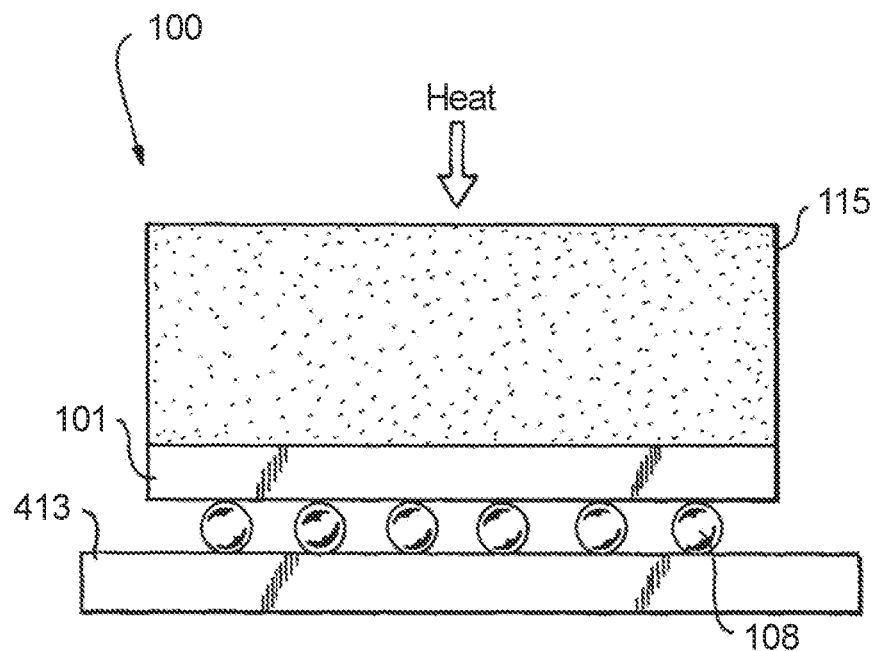
FIG. 4A show a schematic view of an embodiment of a BGA assembly disposed on a mating printed circuit board (PCB) before reflow.
Figure 4B:
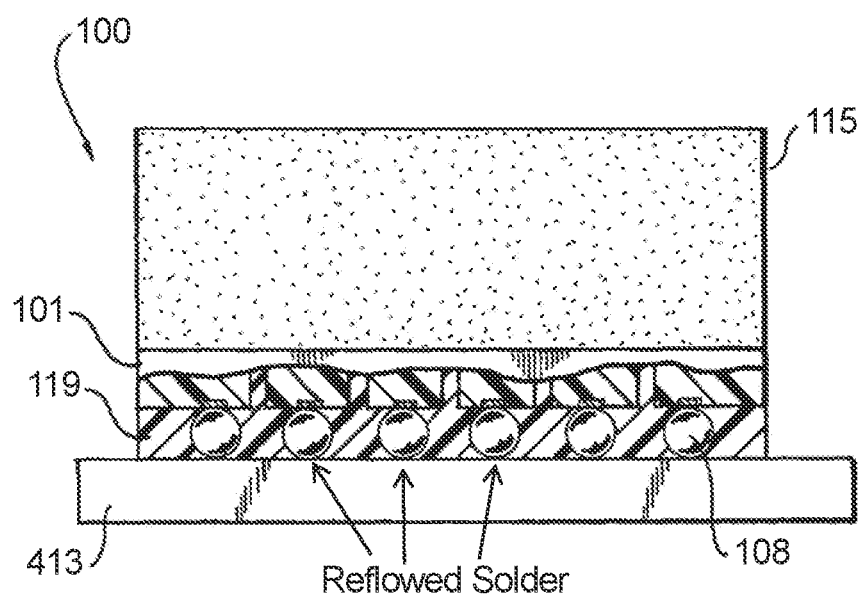
FIG. 4B shows the embodiment of FIG. 4A during and/or after reflow wherein the underfill material has ejected from the BGA assembly, showing the component substrate in cross-section.

Referring generally to FIGS. 1-3C, in accordance with at least one aspect of this disclosure, a ball grid array (BGA) assembly 100 can include a component substrate 101 (e.g., a BGA printed circuit board (PCB)) having a first side 103 and a second side 105 (e.g., as shown in FIG. 2C). The component substrate 101 includes one or more underfill channels 107 defined therethrough that are configured to fluidly communicate the first side 103 of the component substrate 101 and the second side 105 of the component substrate 101. As shown in FIG. 2C, the assembly 100 can include one or more internal components 109 (e.g., a die or any other suitable conventional electrical components which are mounted to a substrate) mounted on the first side 103 of the component substrate 101, and a plurality of pads or leads 111 exposed on the second side 105 that are configured to be soldered to a mating PCB 413 (e.g., as shown in FIGS. 4A and 4B), e.g., with solder balls 108 pre-attached to the pads or leads 111.

The assembly 100 includes a cover 115 mounted to the component substrate 101 over the first side 103 of the component substrate 101. Referring to FIG. 2C, the cover 115 is shaped to create a reservoir cavity 117 between the first side 103 of the component substrate 101 and the cover 115. The assembly 100 also includes an underfill material 119 disposed within the reservoir cavity 117 such that the underfill material 119 in a liquid state flows through the one or more underfill channels 107 to provide underfill material between the component substrate 101 and the mating PCB 413 when the component substrate 101 is soldered to the mating PCB 413, e.g., during a conventional reflow process. The reservoir cavity 117 can include any suitable shape and/or size, and/or any suitable compartments.

The assembly 100 can include a gas 121 disposed in the reservoir cavity 117 above the underfill material 119 to push the underfill material through the underfill channels 107 when the underfill material 119 is in a liquid state. The gas 121 can be an inert gas, e.g., nitrogen, argon, or helium, or any other suitable gas.

In certain embodiments, the assembly 100 can include a solder ball 108 disposed on each lead 111. For example, a solder ball 108 can be pre-attached to each lead 107 that is intended to be used in the electrical circuit, or a plurality of solder balls 108 for any other suitable pattern of pads or leads 111, or all pads or leads 111.

The underfill material 119 in the cavity can be in an uncured state (in either in a solid state or liquid state) at an operating temperature (e.g., room temperature) below reflow temperature (e.g., melting point of solder) and in a liquid state at least at or above reflow temperature. For example, the underfill material 119 can have a melting point below solder. In certain embodiments, the underfill material 119 can be a polymer. Any other suitable material is contemplated herein.

The one or more underfill channels 107 can include a plurality of underfill channels 107 as shown. In certain embodiments, as shown in FIGS. 2B and 2C, each of the plurality of underfill channels 107 can be defined in the component substrate 101 between the plurality pads or leads 111. The underfill channels 107 can be disposed in the component substrate 101 in any suitable pattern, and/or any suitable relation to the pads or leads 111 and/or other component(s) (e.g., to not be blocked by the one or more internal components 109) of the BGA assembly 100. The one or more under fill channels 107 can include any suitable shape and/or size. For example, one or more of the underfill channels 107 can be a traditional via through the component substrate 101.

In certain embodiments, the one or more underfill channels 107 in the component substrate 101 can be filled with a resin compound that is selected for its ability to activate after reaching reflow temperatures and that activation slowly begins the process of liquefying the material in the channels to allow the underfill material 119 (either in a liquid state initially, or a liquefied state due to reflow temperature) to flow only after the solder balls 108 have solidified. This can allow the underfill material 119 to fill the space between the solidified solder balls 108. One having ordinary skill in the art knows what a suitable resin compound would be for a particular application to cause melting of the resin compound only after reflow temperatures.

In certain embodiments, the predetermined resin compound and/or the underfill material 119 can include a chemical processes for activation and/or solidification. For example, embodiments can include two different underfill materials in the cavity, each melting at slightly different temperatures. Once the resin compound in the underfill channels 107 is melted, an already liquefied underfill material 119 in the cavity can flow freely through the channels 107.

For temperature curing, embodiments can include an additive that is activated by high temperature to quickly solidify the underfill at temperature. In certain embodiments, for UV curing, a UV sensitive additive can allow solidification the underfill when exposed to a UV light. The predetermined resin may activate the chemical process of melting after exposure to reflow temperatures.

The reflow temperature (e.g., about 230 C) can be such that the heat provides the cure to solidify the underfill material 119 during the process. In certain embodiments the thermal curing process can seal the underfill channels 107 in the component substrate 101 and provides additional strength between the component substrate 101 and the mating PCB 413.

As shown in the embodiment of FIGS. 2A-2C, the underfill material 119 is in an uncured state (e.g., solid or liquid) and the gas 121 is sealed in the reservoir cavity 117. As shown in FIG. 3A-3C, the underfill material 119 has been ejected from the reservoir cavity 117 by heating the BGA assembly 100 (e.g., during reflow of the solder balls 108) which liquefies the underfill material, which also causes the gas 121 to expand and push the liquefied underfill material 119 through the underfill channels 107. For example, the volumetric ratio of underfill material 119 to gas 121 can be selected as a function of intended heating temperature to cause a predetermined amount of underfill to eject due to the expansion of the gas 121 through underfill channels 107 without causing blowout and still allowing sealing of the underfill holes 107 after reflow.

In accordance with at least one aspect of this disclosure, an embodiment of a ball grid array (BGA) assembly can include a component substrate having at least one underfill channel defined therethrough providing fluidic communication between a first side of the component substrate and a second side of the component substrate, a plurality of pads or leads exposed on the second side and configured to be soldered to a mating PCB, a cover mounted to the component substrate defining a reservoir cavity between the first side and the cover, and an underfill material disposed within the reservoir cavity such that the underfill material can flow through the at least one underfill channel to a gap defined between the second side and the mating PCB when the component substrate is being soldered to the mating PCB.

In accordance with at least one aspect of this disclosure, a method for making a ball grid array (BGA) assembly (e.g., assembly 100) can include inserting an underfill material into a reservoir cavity inside a cover of a BGA assembly. Inserting the underfill material can include inserting less than the total volume of the reservoir cavity such that there is a gas pocket between the underfill material and the cover. Inserting the underfill material can include injecting the underfill material in a heated liquid state through one or more underfill channels defined through a component substrate of the BGA assembly. Any other suitable method is contemplated herein (e.g., injection through the cover using a one way valve disposed in the cover).

The method can include allowing the underfill material to cool and solidify such that the underfill material blocks the one or more underfill channels to seal the reservoir cavity (e.g., thereby sealing in a gas). In certain embodiments, the method can be performed in an environment of inert gas such that the gas pocket is a pocket of inert gas.

Referring additionally to FIGS. 4A and 4B, in accordance with at least one aspect of this disclosure, a method of installing a ball grid array (BGA) assembly can include placing the BGA assembly (e.g., BGA assembly 100 as described above and wherein each lead has a solder ball connected thereto) on a mating PCB 413 such that solder balls 108 of the BGA contact the mating PCB 413. The method can include applying heat to the BGA assembly, as shown in FIG. 4A, to cause reflow of the solder balls 108 and melting of the underfill material 119, and allowing underfill material 119 to flow from the reservoir cavity 117, through the one or more underfill channels 107, and out of the second side 105 of the component substrate 101 to eject underfill material 119 around the solder balls 108 to cause underfilling of the BGA assembly 100, as shown in FIG. 4B.

The method can include allowing the underfill material 119 to cool to seal the one or more underfill channels 107, e.g., from the underside of the component substrate 101. The method can include applying heat causes a gas 121 to expand the gas 121 within the reservoir cavity 117 to push the underfill material 119 through the one or more underfill channels 107.

In accordance with at least one aspect of this disclosure, an embodiment of a method of soldering a ball grid array (BGA) to a printed circuit board (PCB) can include heating an underflow material within a cavity defined between a cover and a first side of a component substrate, flowing the underflow material through at least one channel in the component substrate to a gap defined between a second side of the component substrate and the PCB, the gap including a plurality of solder balls, and soldering the second side to the PCB. The method can include urging the underflow material through the at least one channel with a pressurized gas in the cavity. The method can include pressurizing the gas by increasing temperature of the gas. The method can include liquefying the underflow material with the heating.

Certain embodiments include a self-underfilling BGA assembly. In embodiments, during reflow operations, the underfill material can liquefy and the gas expands due to the high temperature, thereby forcing the underfill through the flow channels. Upon cooling the, underfill solidifies and seals the channels. Underfill can protect against vibration and can help with coefficient of thermal expansion (CTE) thermal mismatch. Embodiments provide a faster, more efficient method of underfilling a BGA assembly, e.g., during the reflow process. Embodiments can be performed without the need of a secondary underfill step using needles or other manual methods.

Any suitable combination(s) of any disclosed embodiments and/or any suitable portion(s) thereof is contemplated therein as appreciated by those having ordinary skill in the art.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A method of soldering a ball grid array (BGA) to a printed circuit board (PCB), comprising:
    heating an underflow material within a cavity defined between a cover and a first side of a component substrate;
    flowing the underflow material through at least one channel in the component substrate to a gap defined between a second side of the component substrate and the PCB, the gap including a plurality of solder balls; and
    soldering the second side to the PCB.

2. The method of claim 1, further comprising urging the underflow material through the at least one channel with a pressurized gas in the cavity.

3. The method of claim 2, further comprising pressurizing the gas by increasing temperature of the gas.

4. The method of claim 1, further comprising liquefying the underflow material with the heating.

5. The method of claim 1, further comprising allowing the underfill material to cool to seal the one or more underfill channels.

* * * * *